United States Patent
Remsburg

(10) Patent No.: US 10,101,097 B2
(45) Date of Patent: Oct. 16, 2018

(54) HEAT SINK HAVING THERMAL DISTORTION COMPENSATION

(71) Applicant: Ralph Remsburg, Midland, TX (US)

(72) Inventor: Ralph Remsburg, Midland, TX (US)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/275,452

(22) Filed: Sep. 25, 2016

(65) Prior Publication Data

US 2018/0087846 A1    Mar. 29, 2018

(51) Int. Cl.
| | | |
|---|---|---|
| *F28F 1/42* | (2006.01) | |
| *F28F 3/02* | (2006.01) | |
| *H01L 23/367* | (2006.01) | |
| *H01L 23/467* | (2006.01) | |
| *H01L 23/473* | (2006.01) | |
| *F28F 1/12* | (2006.01) | |

(52) U.S. Cl.
CPC .............. *F28F 1/42* (2013.01); *F28F 1/124* (2013.01); *F28F 3/022* (2013.01); *H01L 23/3677* (2013.01); *H01L 23/467* (2013.01); *H01L 23/473* (2013.01); *F28F 2215/04* (2013.01); *F28F 2250/02* (2013.01)

(58) Field of Classification Search
CPC .... F28F 1/124; F28F 2250/02; F28F 2215/04; F28F 7/00; H05K 5/00; H05K 7/00; H05K 7/1007; H05K 7/1023; H05K 7/103; H05K 7/14; H05K 7/20; H05K 7/20436; H01L 23/3675; H01L 23/3677; H01L 23/467; H01L 23/473

USPC ......... 165/80.1, 80.2, 80.3; 361/679.01, 688, 361/689, 690, 702, 703, 704, 709
See application file for complete search history.

(56) References Cited

U.S. PATENT DOCUMENTS

| | | | | |
|---|---|---|---|---|
| 5,329,426 A | * | 7/1994 | Villani ................ | H01L 23/4093 24/625 |
| 6,223,815 B1 | * | 5/2001 | Shibasaki ............... | F28F 13/00 165/185 |
| 6,244,332 B1 | * | 6/2001 | Gesklin ............... | H01L 23/3672 165/80.3 |
| 6,390,182 B1 | * | 5/2002 | Sauer .................. | H01L 21/4882 165/80.3 |
| 6,414,846 B1 | * | 7/2002 | Chen ................... | H01L 23/4093 165/185 |
| 6,480,386 B1 | * | 11/2002 | Yu ....................... | H01L 23/4093 165/185 |
| 6,778,395 B1 | * | 8/2004 | Dong .................. | H01L 23/4093 165/80.3 |

(Continued)

*Primary Examiner* — Keith Raymond
*Assistant Examiner* — Gustavo Hincapie Serna
(74) *Attorney, Agent, or Firm* — McDermott Will & Emery LLP

(57) ABSTRACT

A bonded dissimilar material heat transfer assembly is provided. The assembly comprises a frame component, a thin stamped component and at least one dissimilar metal component having means for heat transfer and having a higher thermal conductivity than the frame component and stamped component. The heat transfer assembly includes a novel geometry such that distortion caused by mismatch of thermal expansion rates does not affect the normally planar shape of the assembly. Such a construction leads to higher thermal performance, lighter weight, less cost, and higher reliability than similar prior art heat exchanger assemblies.

20 Claims, 12 Drawing Sheets

(56) References Cited

U.S. PATENT DOCUMENTS

| | | | | |
|---|---|---|---|---|
| 6,809,929 B2* | 10/2004 | Liu | ..................... | H01L 21/4882 |
| | | | | 165/80.2 |
| 6,867,975 B2* | 3/2005 | Kashiwagi | .......... | H01L 23/4093 |
| | | | | 165/185 |
| 6,930,884 B2* | 8/2005 | Cromwell | ........... | H01L 23/4093 |
| | | | | 257/718 |
| 7,345,879 B2* | 3/2008 | Chen | ................... | H01L 21/4882 |
| | | | | 165/185 |
| 8,248,786 B2* | 8/2012 | Cheng | ....................... | G06F 1/20 |
| | | | | 165/104.33 |
| 8,687,368 B2* | 4/2014 | Wu | ........................ | H01L 23/40 |
| | | | | 165/80.3 |
| 9,313,923 B2* | 4/2016 | Davis | ................ | H01L 23/4006 |
| 2008/0223567 A1* | 9/2008 | Liang | ................. | H01L 23/3677 |
| | | | | 165/185 |
| 2016/0341492 A1* | 11/2016 | Watanabe | ........... | H01L 23/3677 |

\* cited by examiner

HEAT SINK HAVING THERMAL DISTORTION COMPENSATION

CROSS REFERENCE TO RELATED APPLICATIONS

This application claims the benefit of provisional patent application Ser. No. 62/248,298, filed 2015 Oct. 30 by the present inventor, which is incorporated by reference.

FEDERALLY SPONSORED RESEARCH

None

SEQUENCE LISTING

None

BACKGROUND—PRIOR ART

The following is a tabulation of some prior art that presently appears relevant:

U.S. Patents

| Patent Number | Kind Code | Issue Date | Patentee |
|---|---|---|---|
| 4,682,651 | A | 1987 Jul. 28 | Gabuzda |
| 5,168,348 | A | 1992 Dec. 1 | Chu et al. |
| 5,365,402 | A | 1994 Nov. 15 | Hatada et al. |
| 6,442,033 | B1 | 2002 Aug. 27 | Liu et al. |
| 7,859,846 | B2 | 2010 Dec. 28 | Hassani et al. |
| 8,897,015 | B2 | 2014 Nov. 25 | Feller et al. |
| 9,282,675 | B2 | 2016 Mar. 8 | Campbell et al. |
| 9,425,124 | A1 | 2016 Aug. 23 | Karidis et al. |

U.S. Patent Application Publications

| Publication No. | Kind Code | Publ. Date | Applicant |
|---|---|---|---|
| 12/273819 | A1 | 2009 Jun. 4 | Mori et al. |
| 12/591929 | A1 | 2010 Jul. 22 | Otsuka et al. |
| 14/500541 | A1 | 2016 Mar. 31 | Schultz |

NONPATENT LITERATURE DOCUMENTS

Williams, J. C., Low Temperature Transient Liquid Phase Bonding of Copper, Thesis Massachusetts Institute of Technology, Dept. of Materials Science and Engineering, 2005

There are many applications for a high integrity bond of aluminum to itself or to a dissimilar metal. In particular, aluminum to dissimilar metal bonds, when the dissimilar metal is copper, are particularly useful in applications requiring high thermal or electrical conductivity, and have been the subject of many prior art disclosures.

However, aluminum and copper have different thermal expansion rates: aluminum at 24 ppm, and copper at 17 ppm. In addition, bonding aluminum to copper usually requires a high temperature process of about 500° C. to 600° C. The high bonding temperature combined with the difference in coefficient of thermal expansion (CTE) causes Al/Cu interfaces to experience high rates of stress and strain upon cooling to room temperature. Upon cooling, a flat interface usually has a bow toward the material side having a higher CTE. Bowing continues to increase as the temperature is lowered below room temperature. Cycling between a cold temperature (−50° C.) and a hot temperature (150° C.) environment such as applied to automotive vehicles, can cause delamination of the interface within 100 cycles.

In an attempt to correct the bowing, many manufacturers shave the part so that it has a flat shape at room temperature. Although this does eliminate the bowing at room temperature, the stresses that caused the bowing are still locked to the interface, and will cause failure upon thermal cycling. This also does not prevent bowing at higher and lower temperatures than room temperature.

In addition to the Al/Cu CTE differential, components bonded to the metals may increase CTE bowing further. For example, it is common to bond an aluminum pin-fin heat sink to a flat copper base, and then solder electronic components to the copper base. Many electronic components composed of silicon have a CTE of about 8 ppm. The combination of CTEs (component at 8 ppm, Cu at 17 ppm, Al at 24 ppm) causes severe bowing and failure in the Al/Cu interface and in the Cu/Si interface.

Functionally graded materials, wherein a material may be engineered to have a higher CTE on one side than the other side, my alleviate part of the problem. For example, a heat sink that has the attributes of aluminum on the finned side and the attributes of copper on the base side can spread out the stress so that the Al/Cu interface will survive thermal cycling. By further optimizing the functionally graded material (FGM), a heat sink can have aluminum attributes on the finned side, transition to a copper material, and then to a molybdenum material. In this manner, the soldered component will see little stress because a copper/molybdenum material has about the same CTE as a silicon component.

Although a FGM can be engineered to provide a lower stress interface for soldered electronic components, the deformation caused by bonding high CTE materials to low CTE materials is still unaccounted for. Since it is helpful in many application to gang electronic components together, the thermal deformation for each component is additive. For example, a silicon chip soldered to a copper heatsink will cause some deformation upon cooling to room temperature. If a second chip is soldered along the same axis, the deformation in that axis will be doubled upon cooling, and if there are three components in a straight line, the deformation will be 3× the deformation for one component.

In conclusion, as far as I am aware, there is no known solution to the problem of thermal deformation of bonded materials having different rates of thermal expansion.

SUMMARY

In accordance with one embodiment, an interface comprised of a relatively low CTE material and a relatively high CTE contains a nonobvious feature to greatly reduce thermally induced distortion.

Advantages

Accordingly, several advantages of one or more aspects are as follows: to minimize the thermal distortion caused by bonding dissimilar CTE materials together, to provide a lower-cost alternative to prior art bonding methods for dissimilar materials, to allow bonding of dissimilar materials at a lower temperature, which provides less deformation caused by differences in coefficient of thermal expansion. Other advantages of one or more aspects will be apparent from a consideration of the drawings and ensuing description.

DRAWINGS—FIGURES OF THE EMBODIMENTS

DRAWINGS—REFERENCE NUMERALS

10—Prior Art Aluminum Copper Heat Sink Construction
11—Prior Art Copper Component
12—Prior Art Aluminum Component
13—Prior Art Aluminum Pin-Fins
14—Prior Art Al/Cu Interface
15—Prior Art Thermal Distortion View
16—Prior Art Solid Copper Heat Sink
17—Electronic Components
18—Prior Art Thermal Distortion
20—Exploded View of Present Invention
21—Aluminum Frame
22—Aluminum Frame Cutout
23—Aluminum Stamping
24—Aluminum Stamping Inner Region
25—Aluminum Stamping Perimeter Region
26—Aluminum Stamping Holes
27—Copper Pin-Fin Heat Sink
28—Copper Pin-Fin Heat Sink Base
29—Copper Pin-Fin Heat Sink Pins
30—Pin-Side View of Present Invention
31—Aluminum Stamping Inner/Outer Transition Wall
32—Mounting Hole
40—Component-Side View of Present Invention
41—Component Bonding Region
42—Heat Sink-Frame Gap
50—Iso Section View of Present Invention
60—Cross Section of Present Invention
61—Frame-Stamping Bonded Interface
62—Stamping-Heat Sink Bonded Interface
70—Normal Temperature Geometry
71—Wall Angle
72—Sliding Interface
73—Pin-Fin-Stamping Gap
80—Below Normal Temperature Geometry
81—Temperature Induced Contraction Force
90—Above Normal Temperature Geometry
91—Temperature Induced Expansion Force
100—Thermal Distortion View
101—Al/Cu Heat Sink
102—Al/Cu Thermal Distortion
110—Functionally Graded Heat Sink
111—Component Mounting Interface
112—Material Gradient
113—Heat Transfer Pin-Fins

DETAILED DESCRIPTION—FIG. 1A AND FIG. 1B—PRIOR ART

Figure 1A:
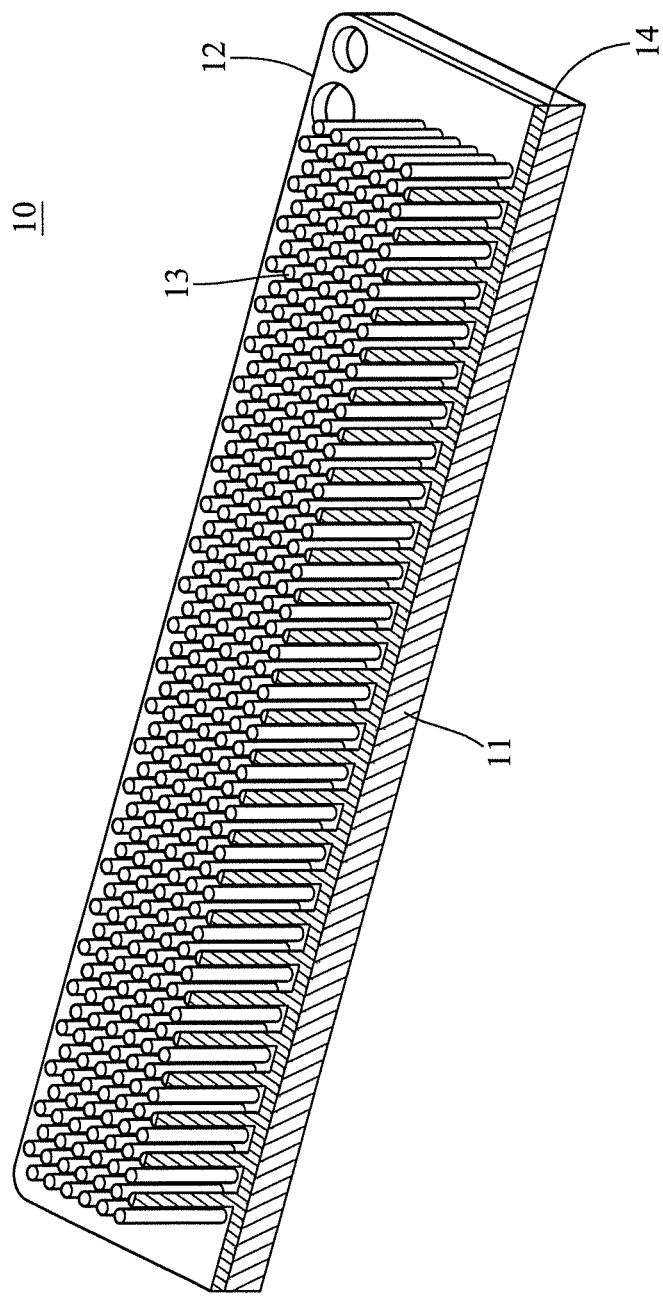
FIG. 1A shows a view of a prior art heat sink constructed of aluminum and copper.

Referring to FIG. 1A a prior art composite heat sink 10 is shown. A large thick conductive plate 11 forms the base of the heat sink and a pin-fin upper surface 12 forms the top. Conductive plate 11 should be constructed of a highly heat conductive material. Performance of prior art heat sink 10 depends on the ability of conductive plate 11 to spread heat from components mounted on the exposed planar face. Although many materials may be used, in this embodiment the material is copper. The upper portion 12 of heat sink 10 is designed to transfer the heat by convection to a gaseous or liquid media. In order to increase the surface area, a plurality of pin-fins 13 are constructed in the upper surface. Because low cost and weight are beneficial, the upper plate is constructed of aluminum in this embodiment. The planar faces of copper plate 11 and aluminum component 12 are bonded at interface 14.

In prior art heat sink 10, interface 14 is subjected to very high stress levels because of the coefficient of thermal expansion difference between copper and aluminum. The process used to bond component 11 and component 12 must withstand these high stress levels. There are many processes that provide a high strength bond between aluminum and copper; brazing, diffusion bonding and linear friction welding are popular processes. However, these processes require that the bond occurs between about 500° C. and 600° C. When the part cools to room temperature, severe distortion can be seen caused by the different rates of thermal contraction. In many applications, such as automotive and aerospace, the heat sink must also withstand use at cold temperatures of −65° C. The stress resulting from this roughly 600° C. temperature change causes many bonds to fail.

In order to maximize heat transfer from the components to the coolant, the ratio of plate 11 thickness to aluminum component 12 should be as high as possible, favoring the material having higher thermal conductivity. In this prior art design, the thickness of aluminum component 12 restricts heat flow because the thermal conductivity of aluminum is roughly ½ that of copper. This prior art design has less mass than a solid copper heat sink, but is still considered to be heavy and expensive, has low thermal performance, and low reliability.

Because of these limitations many heat sinks constructed of aluminum and copper fail. In an attempt to maintain reliability and higher thermal performance many manufacturers use solid copper blocks.

Figure 1B:
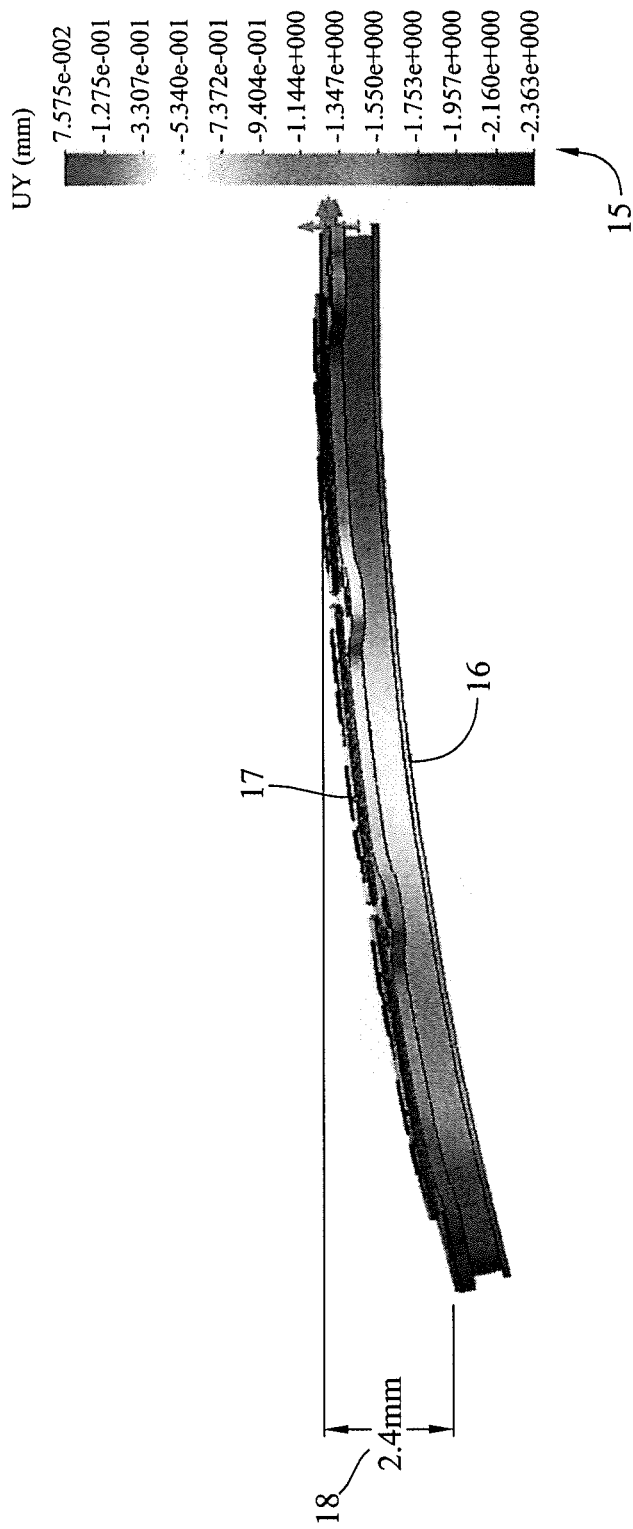
FIG. 1B shows an exaggerated view of the thermal distortion of a prior art heat sink constructed of aluminum and copper.

FIG. 1B depicts a thermally deformed solid copper heat sink 15 with electronic components 17. Copper heat sink 16 has a plurality of electronic components 17 mounted to the exposed planar face. Electronic components are often soldered to heat sink 16 to improve thermal performance over that of thermal grease. Soldering of high power devices often occurs at about 250° C. Because silicon has a lower CTE than copper or aluminum, when the part cools from the 250° C. process temperature, the heat sink will bow in a direction toward the material with the higher CTE, copper. Using a solid copper plate roughly 250 mm long, a 250° C. process temperature, and then cooling to −50° C., results in thermal deformation 18 of 2.4 mm. Such a high value of deformation is often beyond the capability of soldered joints, and electronic components 17 can fail from delamination.

DETAILED DESCRIPTION—FIG. 2 THROUGH FIG. 6

Figure 2:
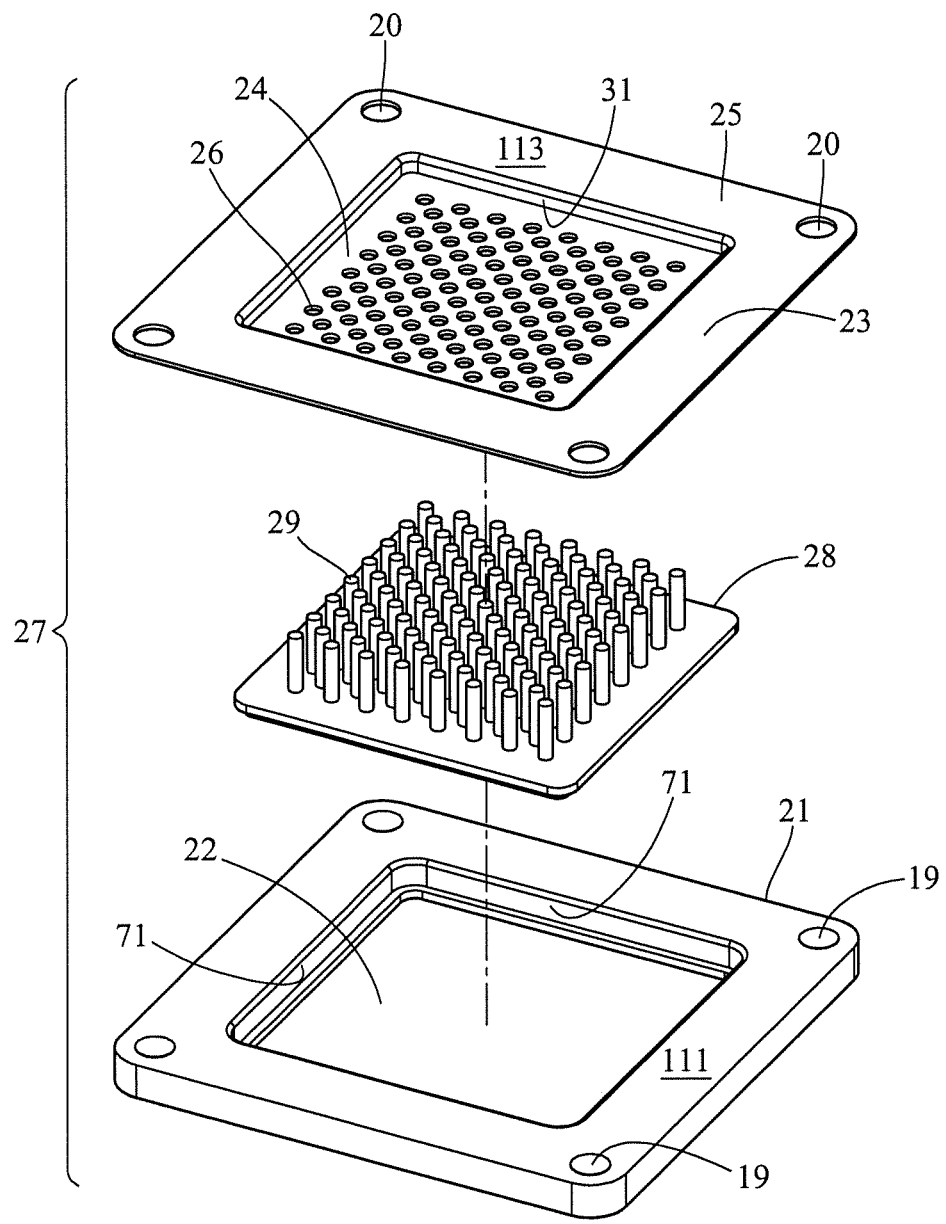
FIG. 2 shows a pin-side view of a present invention heat sink constructed of aluminum and copper.

Referring now to FIG. 2 an embodiment of the present invention is shown in an exploded view 20. An aluminum frame 21 has one or more cutouts 22. A copper heat sink 27 is comprised of a planar base 28 and a plurality of pin-fins 29. A thin aluminum stamping 23 is comprised of an inner region 24 and an outer perimeter region 25. Inner region 24 has a plurality of holes 26 in a shape and pattern that matches the shape and pattern of pin-fins 29 of heat sink 27. During assembly copper heat sink 27 is sandwiched between aluminum stamping 23 and aluminum frame 21. It is noted that pin-fins, aluminum, and copper are used by example, and many other fin shapes and materials are possible.

Figure 3:
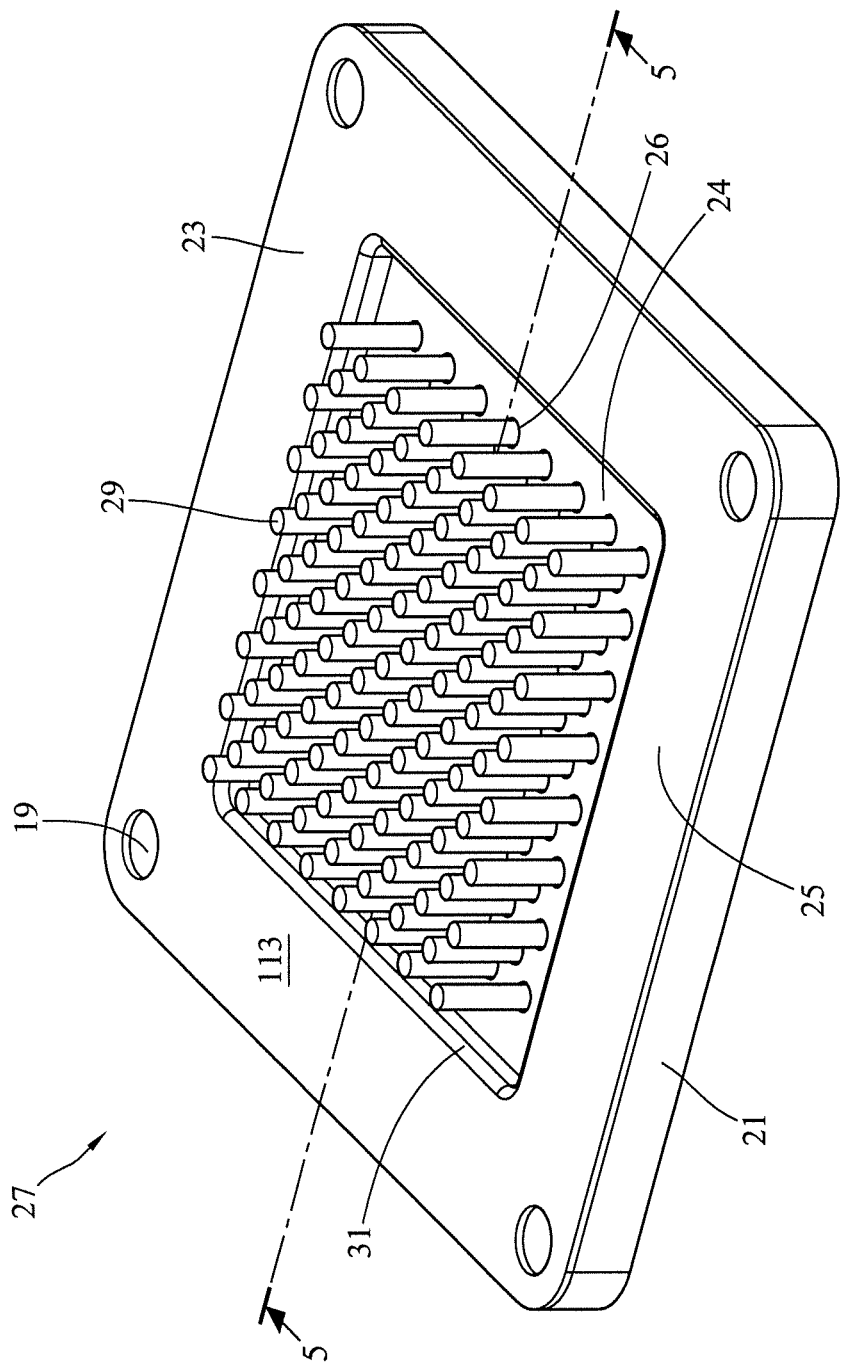
FIG. 3 shows a component-side view of a present invention heat sink constructed of copper and aluminum.

Referring now to FIG. 3 a heat sink assembly embodiment 30 of the present invention is shown. FIG. 3 depicts the pin-fin side of heat sink 30. This view shows more clearly inner region 24 of aluminum stamping 23, and holes 26 that correspond to heat sink pin-fins 29. Inner region 24 can be manufactured to be higher or lower in relation to the plane of outer perimeter 25. The transition between the raised or lowered region 24 and perimeter region 25 is transition wall 31. Mounting holes 32 are often required.

Figure 4:
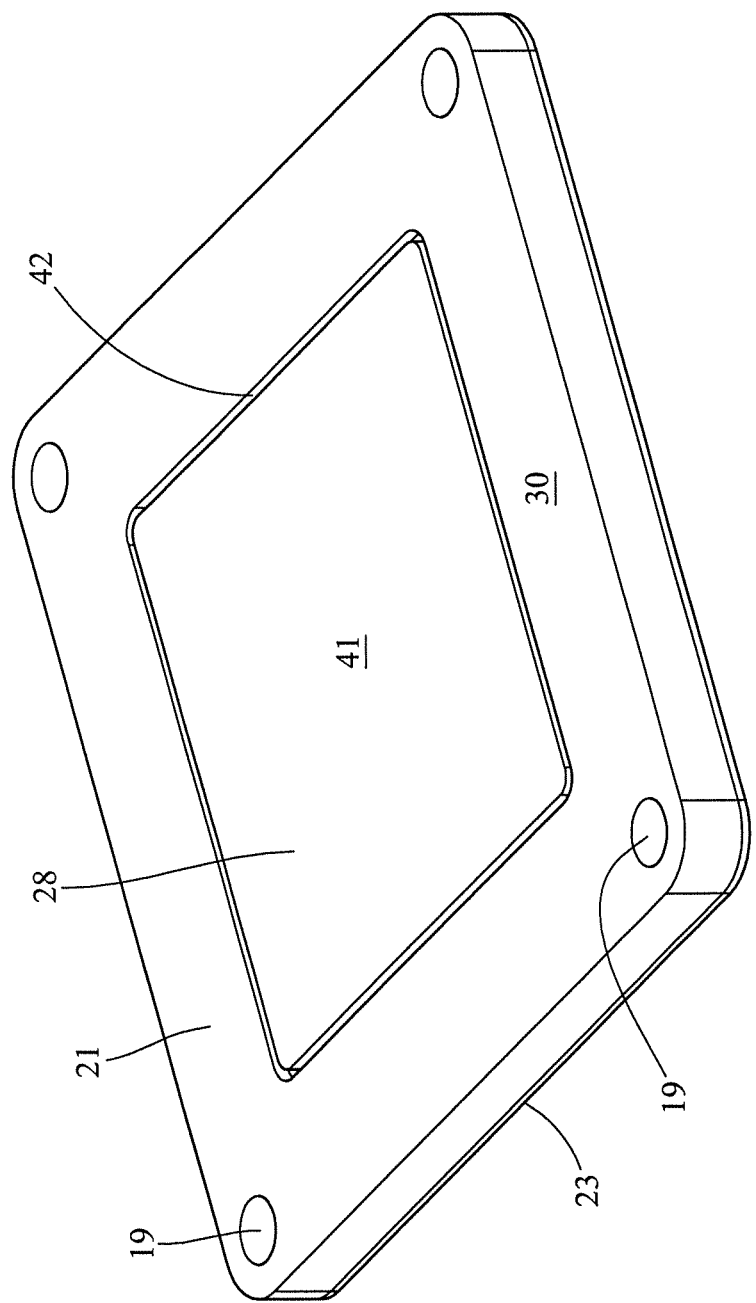
FIG. 4 shows an exploded view of a present invention heat sink constructed of copper and aluminum.

Referring now to FIG. 4, component side 40 of the present invention heat sink is shown. Heat sink component side 41 is usually a flat face with a surface that is wettable with solder. There is a clearance gap 42 between the face of heat sink 41 and the face of aluminum frame 21.

Figure 5:
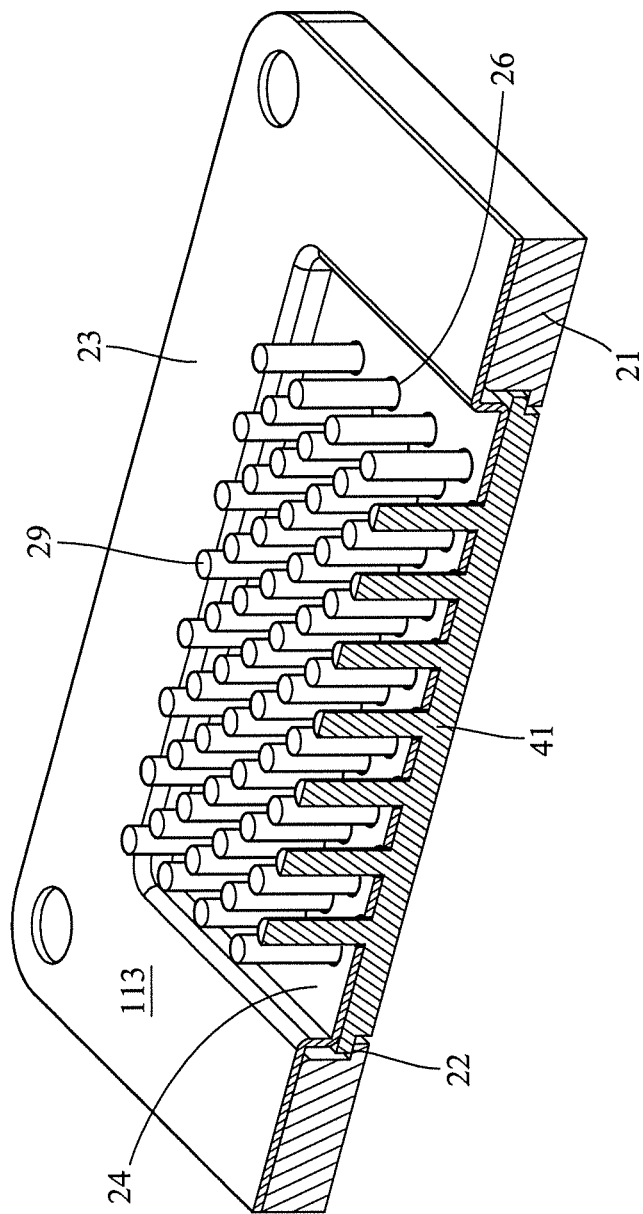
FIG. 5 shows an iso sectional view of a present invention heat sink constructed of copper and aluminum.

Referring now to FIG. 5, an iso section view 50 of the heat sink of the present invention is shown. In this view it is clear that heat sink pin-fins 29 protrude through holes 26 in the inner region 24 of aluminum stamping 23.

Figure 6:
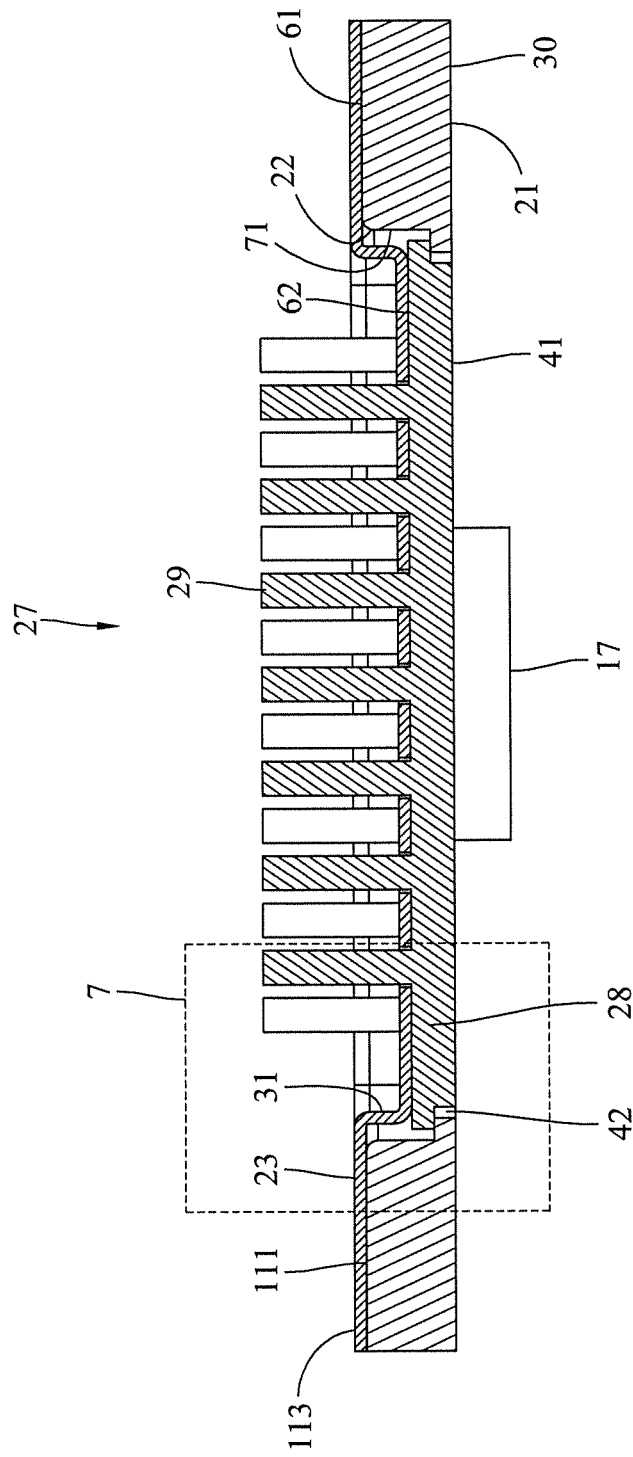
FIG. 6 shows a cross-section view of a present invention heat sink constructed of copper and aluminum.

Referring now to FIG. 6, a frontal cross section view 60 of the present invention is shown. Aluminum frame 21 is bonded to aluminum stamping 23 along interface 61. Aluminum stamping 23 is bonded to copper heat sink 27 along interface 62. Electrical component 17 is soldered to component face 41 of heat sink 27.

Bonding interface 61 and 62 can be diffusion bonded or brazed to affect an airtight seal, but these processes can cause excessive deformation because of the high processing temperatures. In the preferred embodiment a variation of low temperature transient liquid phase (LTTLP) bonding is employed. This process uses temperatures of about 250° C., so the resulting stress is less than half of diffusion bonding or brazing. Although bonding occurs at 250° C., the bonded items can be used in 400° C. environments. Therefore, the heat sink of the present invention can be manufactured and after completion, components can be soldered onto the assembly at temperatures higher than 250° C., without adding extra stress.

Figure 7:
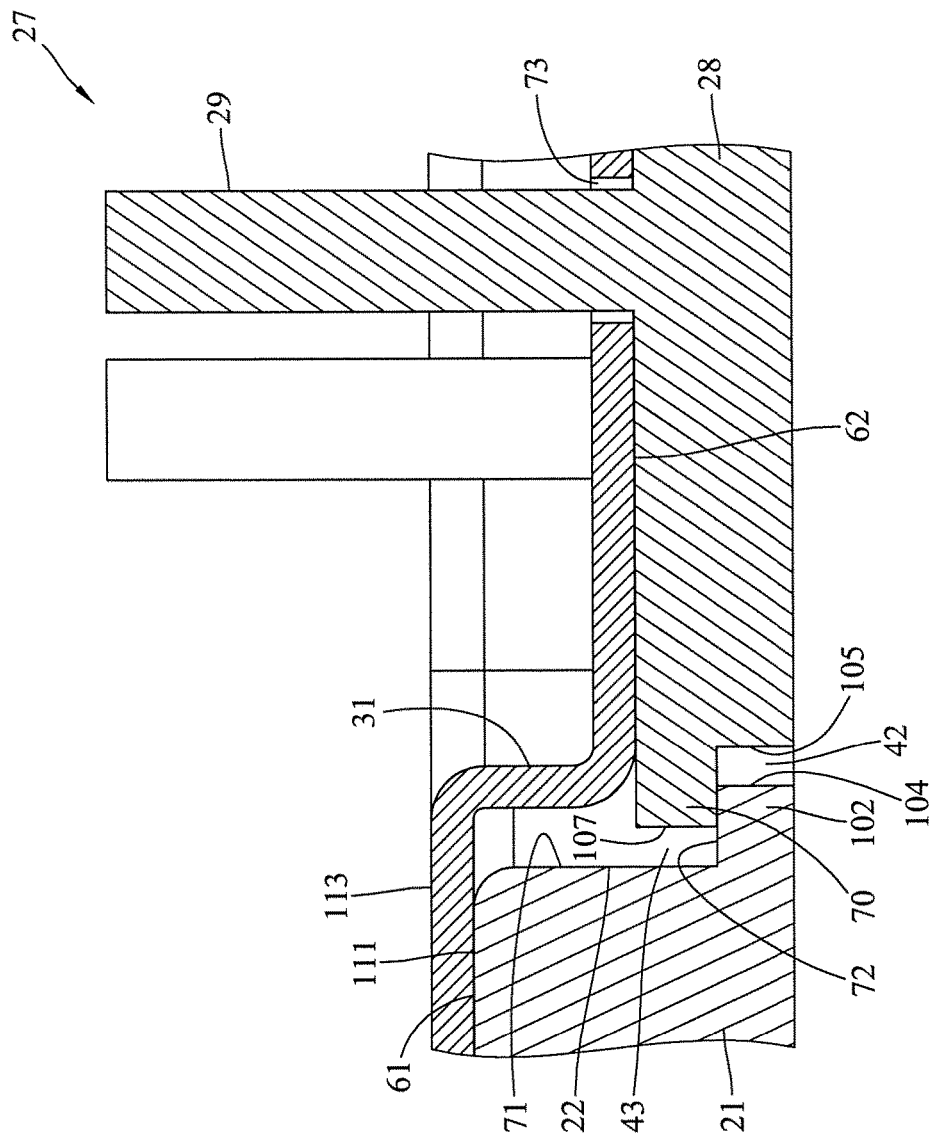
FIG. 7 shows a close-up view of the interface geometry of the present invention at normal operating temperature.

Referring now to FIG. 7, there is a tight gap 73 between heat sink pin-fin 29 and aluminum stamping 21. The tight gap increases the yield strength of interface bond 62.

OPERATIONAL DESCRIPTION—FIG. 7 THROUGH FIG. 10

Referring again to FIG. 7 a view of the present heat sink invention is shown 70 at a normal operational temperature. Transition wall 31 is largely perpendicular to the plane of the heat sink assembly, and is parallel 71 to cutout 22 of aluminum frame 21. A nonbonded sliding surface 72 allows movement between aluminum frame 21 and copper heat sink 27.

Figure 8:
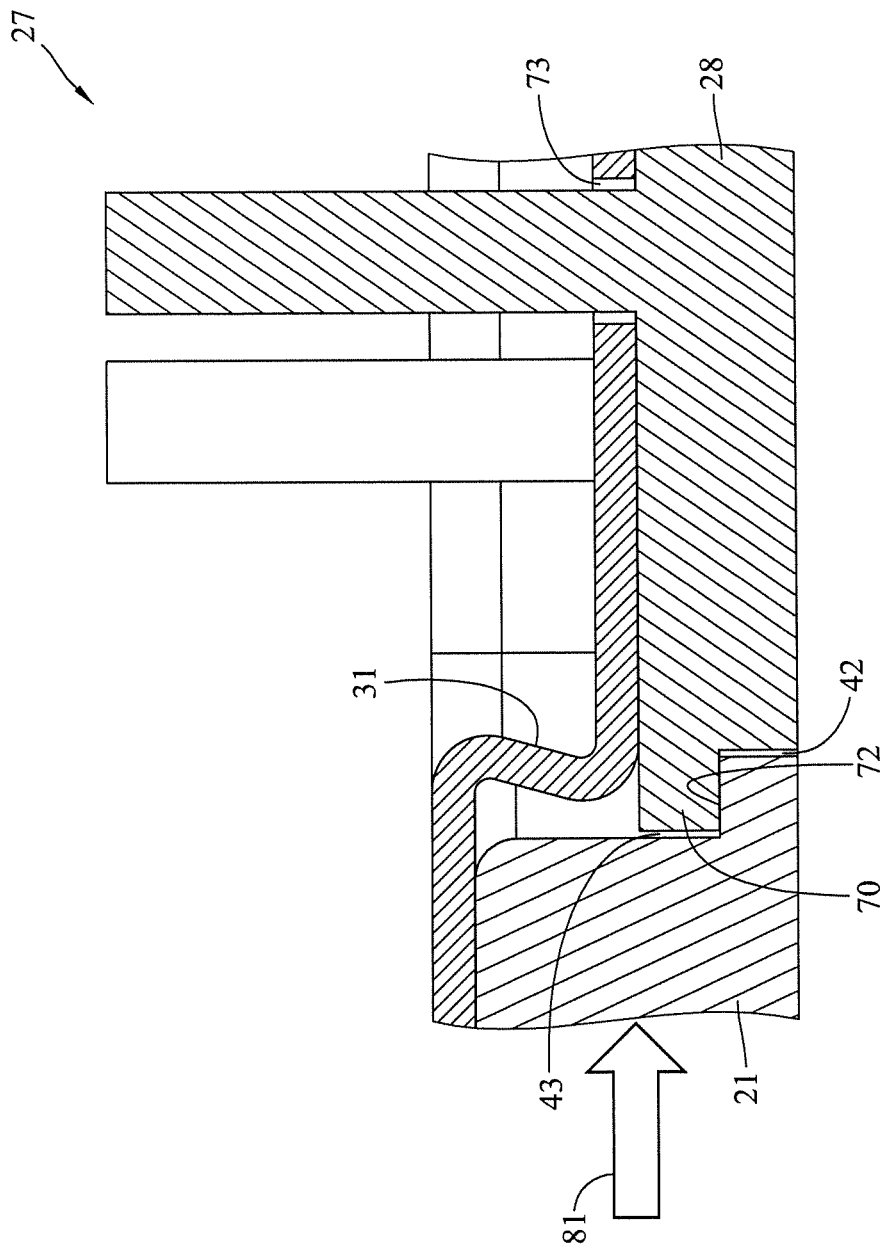
FIG. 8 shows a close-up view of the interface geometry of the present invention at below normal operating temperature.

Referring now to FIG. 8 a view of the present heat sink invention is shown 80 at a temperature below normal operating temperature. A contraction force 81 is induced by the cold temperature. Because aluminum has a higher CTE than copper, aluminum frame 21 contracts more than copper heat sink 27. The heat sink assembly does not deform because gap 42 accepts movement between aluminum frame 21 and heat sink 27, supported by sliding interface 72. Transition wall 31 deflects to accept the relative spacing change. The deflection is indicated by angle 71.

Figure 9:
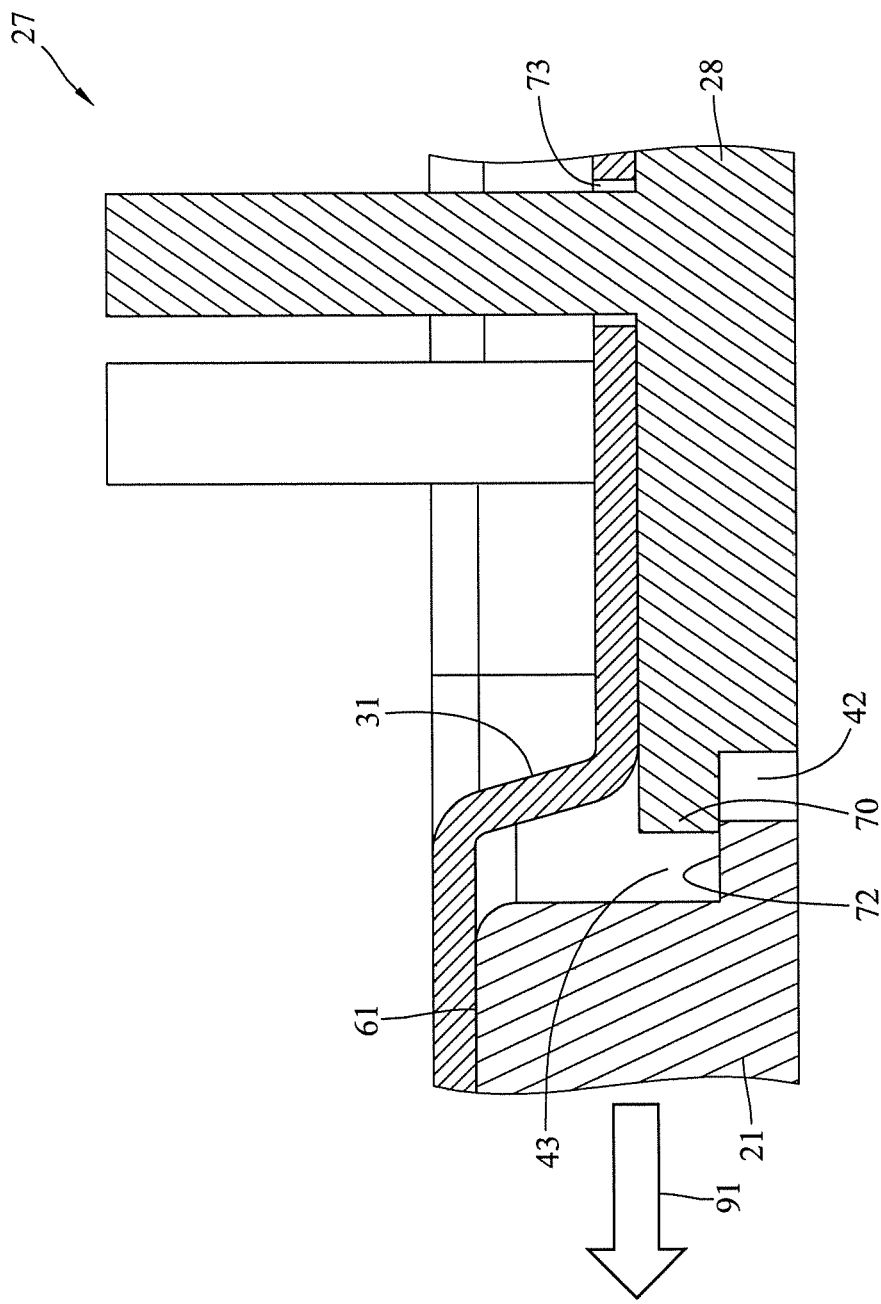
FIG. 9 shows a close-up view of the interface geometry of the present invention at above normal operating temperature.

Referring now to FIG. 9 a view of the present heat sink invention is shown 90 at a temperature above normal operating temperature. An expansion force 91 is induced by the higher temperature. Because aluminum has a higher CTE than copper, aluminum frame 21 expands more than copper heat sink 27. The heat sink assembly does not deform because gap 42 accepts movement between aluminum frame 21 and heat sink 27, supported by sliding interface 72, and transition wall 31 deflects to accept the relative spacing change. The deflection is indicated by angle 71.

Figure 10:
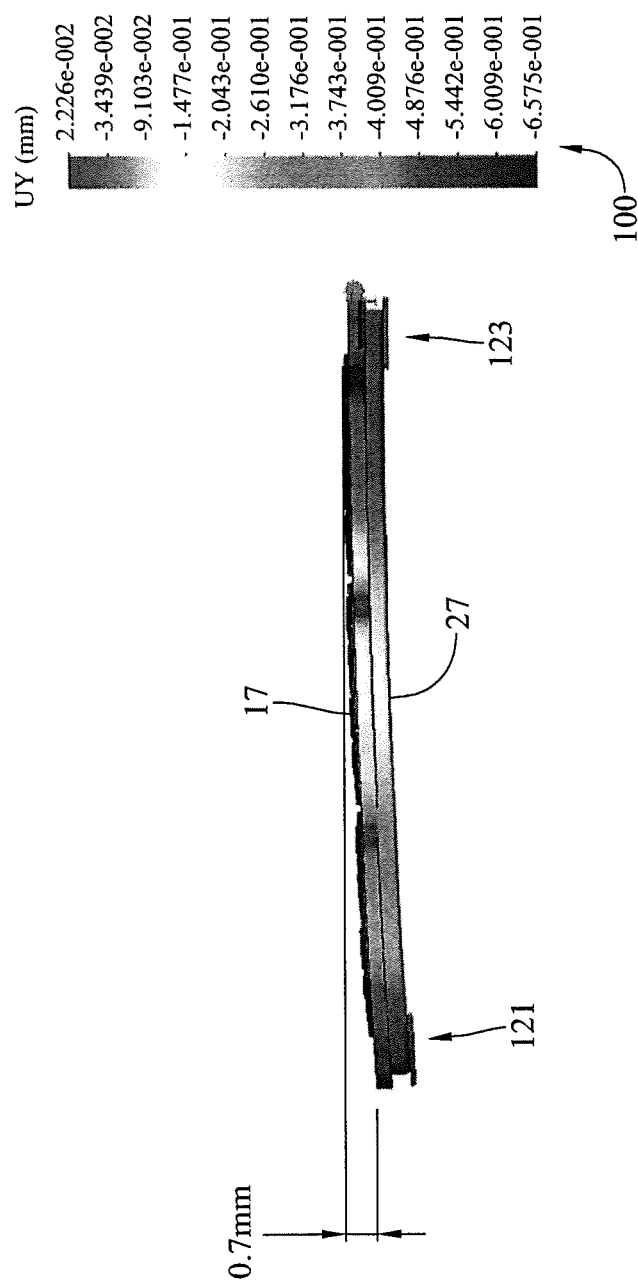
FIG. 10 shows an exaggerated view of the thermal distortion of the present invention heat sink constructed of aluminum and copper.

FIG. 10 depicts a thermally deformed Al/Cu heat sink 100 of the present invention with electronic components 17. Al/Cu heat sink 101 has a plurality of electronic components 17 mounted to the exposed planar face. Electronic components are often soldered to heat sink 101 to improve thermal performance over that of thermal grease. Soldering of high power devices often occurs at about 250° C. Because silicon has a lower CTE than copper or aluminum, when the part cools from the 250° C. process temperature, the heat sink will bow in a direction toward the material with the higher CTE. Using an Al/Cu heat sink of the present invention roughly 250 mm long, a 250° C. process temperature, and then cooling to −50° C., results in thermal deformation 102 of 0.7 mm. This is roughly ⅓ of the deformation of a prior art heat sink. Such a low value of deformation is well within the capability of soldered joints, and electronic components 17 would be expected to survive many thermal cycles.

ADDITIONAL EMBODIMENT

Figure 11:
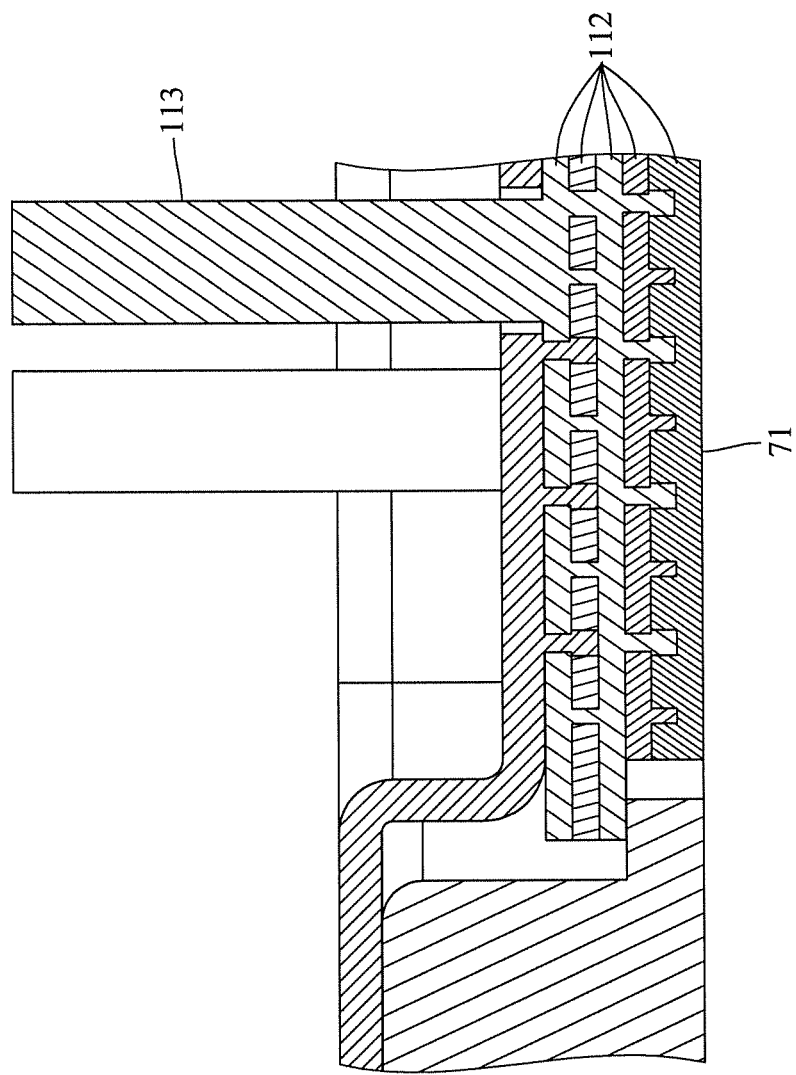
FIG. 11 shows a section view of a present invention heat sink constructed of functionally graded materials.

An additional embodiment 110 is shown in FIG. 11. A pin-fin heat sink constructed of a functionally graded material will allow even greater reliability because the CTE of the heat sink component mounting surface 111 is matched to the CTE of silicon. This is accomplished by bonding a plurality of layers 112 of materials having increasingly smaller CTE from heat sink pin-fin 113 to component mounting surface 111.

CONCLUSIONS, RAMIFICATIONS, AND SCOPE

Accordingly, the reader will see that at least one embodiment of the heat sink apparatus produces a product that has higher thermal performance, less weight, lower cost, and higher reliability than the prior art configurations.

While my above descriptions contain many specificities, these should not be construed as limitations of the scope, but rather as an exemplification of one or several embodiments thereof. Many other variations are possible. For example, instead of using copper and aluminum, other materials may be used; instead of lowering inner region 24, region 24 could be raised; a different bonding process than LTTLP may be used; other specificities may have particular advantages in specific applications; etc.

Accordingly, the scope should be determined not by the embodiments illustrated, but by the appended claims and their legal equivalents.

What is claimed is:

1. A heat sink assembly, comprising:
   a frame having a receiving space;
   a heat sink including a base and a plurality of pin-fins or other extended surfaces protruding from the base, wherein the base is disposed inside the receiving space to form an unoccupied space between the frame and the base; and
   a stamping piece having an inner region fixed on the base, an outer perimeter region fixed on the frame, and a transition wall suspendedly connected between the inner region and the outer perimeter region, wherein the inner region has a plurality of holes for the extended surface fins to pass through respectively.

2. The heat sink assembly according to claim 1, wherein the frame has an inner surrounding protrusion extended from an inner surface thereof, the base has an outer surrounding protrusion extended from an outer surface thereof, and the outer surrounding protrusion is slidably disposed on the inner surrounding protrusion to adjust a width of the unoccupied space.

3. The heat sink assembly according to claim 2, wherein the unoccupied space has a first surrounding gap and a second surrounding gap separated from the first surrounding gap, the first surrounding gap is formed between an inner surface of the frame and the outer surrounding protrusion of the base, and the second surrounding gap is formed between an outer surface of the base and the inner surrounding protrusion of the frame.

4. The heat sink assembly according to claim 1, wherein each pin-fin passes through the corresponding hole to form a fixed surrounding gap between an inner surface of the hole and the pin-fin.

5. The heat sink assembly according to claim 1, wherein the inner region and the outer perimeter region of the frame are fixed on the base and the frame respectively through bonding.

6. The heat sink assembly according to claim 1, wherein the frame is made of a first material having a first coefficient of thermal expansion, the stamping piece is made of a second material having a second coefficient of thermal expansion and the heat sink is made of a third material having a third coefficient of thermal expansion, and the first coefficient of thermal expansion and the second coefficient of thermal expansion are the same or different and are higher than the third coefficient of thermal expansion.

7. The heat sink assembly according to claim 1, wherein the frame and the stamping piece are made of aluminum.

8. The heat sink assembly according to claim 7, wherein the heat sink is made of copper.

9. The heat sink assembly according to claim 1, wherein the heat sink is formed by a functionally graded material.

10. The heat sink assembly according to claim 9, wherein the functionally graded material comprises a plurality of materials having coefficients of thermal expansion decreases from a bottom of the base toward the pin-fins.

11. An electrical device including at least one heat-generating element and a heat sink assembly disposed on the at least one heat-generating element, the heat sink assembly comprising:
    a frame having a receiving space;
    a heat sink including a base disposed on the at least one heat-generating element and a plurality of pin-fins extended from the base, wherein the base is disposed inside the receiving space to form an unoccupied space between the frame and the base; and
    a stamping piece having an inner region fixed on the base, an outer perimeter region fixed on the frame, and a transition wall suspendedly connected between the inner region and the outer perimeter region, wherein the inner region has a plurality of holes for the pin-fins to pass through respectively.

12. The electrical device according to claim 11, wherein the frame has an inner surrounding protrusion extended from an inner surface thereof, the base has an outer surrounding protrusion extended from an outer surface thereof, and the outer surrounding protrusion is slidably disposed on the inner surrounding protrusion to adjust a width of the unoccupied space.

13. The electrical device according to claim 12, wherein the unoccupied space has a first surrounding gap and a second surrounding gap separated from the first surrounding gap, the first surrounding gap is formed between an inner surface of the frame and the outer surrounding protrusion of the base, and the second surrounding gap is formed between an outer surface of the base and the inner surrounding protrusion of the frame.

14. The electrical device according to claim 11, wherein each pin-fin passes through the corresponding hole to form a fixed surrounding gap between an inner surface of the hole and the pin-fin.

15. The electrical device according to claim 11, wherein the inner region and the outer perimeter region of the frame are fixed on the base and the frame respectively through low temperature transient liquid phase (LTTLP) bonding.

16. The electrical device according to claim 11, wherein the frame is made of a first material having a first coefficient of thermal expansion, the stamping piece is made of a second material having a second coefficient of thermal expansion and the heat sink is made of a third material having a third coefficient of thermal expansion, and the first coefficient of thermal expansion and the second coefficient of thermal expansion are the same or different and are higher than the third coefficient of thermal expansion.

17. The electrical device according to claim 11, wherein the frame and the stamping piece are made of aluminum.

18. The electrical device according to claim 17, wherein the heat sink is made of copper.

19. The electrical device according to claim 11, wherein the heat sink is formed by a functionally graded material.

20. The electrical device according to claim 19, wherein the functionally graded material comprises a plurality of materials having coefficients of thermal expansion decreases from a bottom of the base toward the pin-fins.

* * * * *